(12) United States Patent
Murata et al.

(10) Patent No.: US 11,956,896 B2
(45) Date of Patent: Apr. 9, 2024

(54) PRINTED WIRING BOARD

(71) Applicant: IBIDEN CO., LTD., Gifu (JP)

(72) Inventors: Tomohiko Murata, Ogaki (JP);
Yoshiteru Hashimoto, Ogaki (JP);
Yoshiki Kawai, Ogaki (JP); Hideyuki Goto, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 83 days.

(21) Appl. No.: 17/676,505

(22) Filed: Feb. 21, 2022

(65) Prior Publication Data

US 2022/0287175 A1    Sep. 8, 2022

(30) Foreign Application Priority Data

Mar. 2, 2021 (JP) .................................. 2021-032206

(51) Int. Cl.
*H05K 1/02* (2006.01)
*H05K 1/11* (2006.01)

(52) U.S. Cl.
CPC ............ *H05K 1/0298* (2013.01); *H05K 1/11* (2013.01); *H05K 2201/0212* (2013.01); *H05K 2201/0394* (2013.01)

(58) Field of Classification Search
CPC ......... H05K 1/0298; H05K 2201/0212; H05K 2201/0394; H05K 2201/098; H05K 1/11; H05K 3/06

See application file for complete search history.

(56) References Cited

U.S. PATENT DOCUMENTS

| | | | | |
|---|---|---|---|---|
| 6,809,415 B2* | 10/2004 | Tsukada | ............... | H05K 3/3452 361/767 |
| 2004/0011555 A1* | 1/2004 | Chiu | ................... | H05K 3/4647 174/256 |
| 2004/0040739 A1* | 3/2004 | Yoshimura | ........... | H05K 1/0221 174/255 |
| 2007/0284738 A1* | 12/2007 | Shimoishizaka | ....... | H01L 24/11 174/250 |

FOREIGN PATENT DOCUMENTS

JP     2020-191388 A     11/2020

* cited by examiner

*Primary Examiner* — Ishwarbhai B Patel
(74) *Attorney, Agent, or Firm* — Oblon, McClelland, Maier & Neustadt, L.L.P.

(57) ABSTRACT

A printed wiring board includes a first insulating layer, a conductor layer, and a second insulating layer. The conductor layer includes first and second circuits such that space is formed between the circuits, the first circuit has first and second side walls, the second circuit has third and fourth side walls such that the second wall faces the third wall, the first circuit has first, second and third portions, the second circuit has fourth, fifth and sixth portions such that the first and fourth portions, the second and fifth portions and the third and sixth portions face each other, the first circuit is formed such that the second wall of the second portion is recessed from the second wall of the first and third portions, and the first insulating layer has recess between the second and fifth portions such that the second insulating layer is filling the space and recess.

20 Claims, 8 Drawing Sheets

PRINTED WIRING BOARD

CROSS-REFERENCE TO RELATED APPLICATIONS

The present application is based upon and claims the benefit of priority to Japanese Patent Application No. 2021-032206, filed Mar. 2, 2021, the entire contents of which are incorporated herein by reference.

BACKGROUND OF THE INVENTION

Field of the Invention

A technology described herein relates to a printed wiring board.

Description of Background Art

Japanese Patent Application Laid-Open Publication No. 2020-191388 describes a wiring substrate having a first insulating layer, a wiring layer including multiple wiring patterns formed on the first insulating layer, and a second insulating layer formed on a first insulating layer and the wiring layer. In the technology of Japanese Patent Application Laid-Open Publication No. 2020-191388, a width of a space between adjacent wiring patterns is 2 μm-3 μm. The entire contents of this publication are incorporated herein by reference.

SUMMARY OF THE INVENTION

According to one aspect of the present invention, a printed wiring board includes a first resin insulating layer, a conductor layer formed on a surface of the first resin insulating layer, and a second resin insulating layer formed on the surface of the first resin insulating layer such that the second resin insulating layer is covering the conductor layer. The conductor layer includes a first conductor circuit and a second conductor circuit positioned adjacent to the first conductor circuit such that a space is formed between the first conductor circuit and the second conductor circuit, the first conductor circuit has a first side wall and a second side wall on the opposite side with respect to the first side wall, the second conductor circuit has a third side wall and a fourth side wall on the opposite side with respect to the third side wall such that the second side wall of the first conductor circuit faces the third side wall of the second conductor circuit, the first conductor circuit has a first portion, a second portion extending from the first portion, and a third portion extending from the second portion, the second conductor circuit has a fourth portion, a fifth portion extending from the fourth portion, and a sixth portion extending from the fifth portion such that the first portion of the first conductor circuit and the fourth portion of the second conductor circuit face each other, that the second portion of the first conductor circuit and the fifth portion of the second conductor circuit face each other, and that the third portion of the first conductor circuit and the sixth portion of the second conductor circuit face each other, the first conductor circuit is formed such that the second side wall of the second portion is recessed from the second side wall of the first portion and the second side wall of the third portion and that the space formed between the second portion of the first conductor circuit and the fifth portion of the second conductor circuit becomes larger, and the first resin insulating layer has a recess formed between the second portion of the first conductor circuit and the fifth portion of the second conductor circuit such that the second resin insulating layer is filling the space and the recess.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
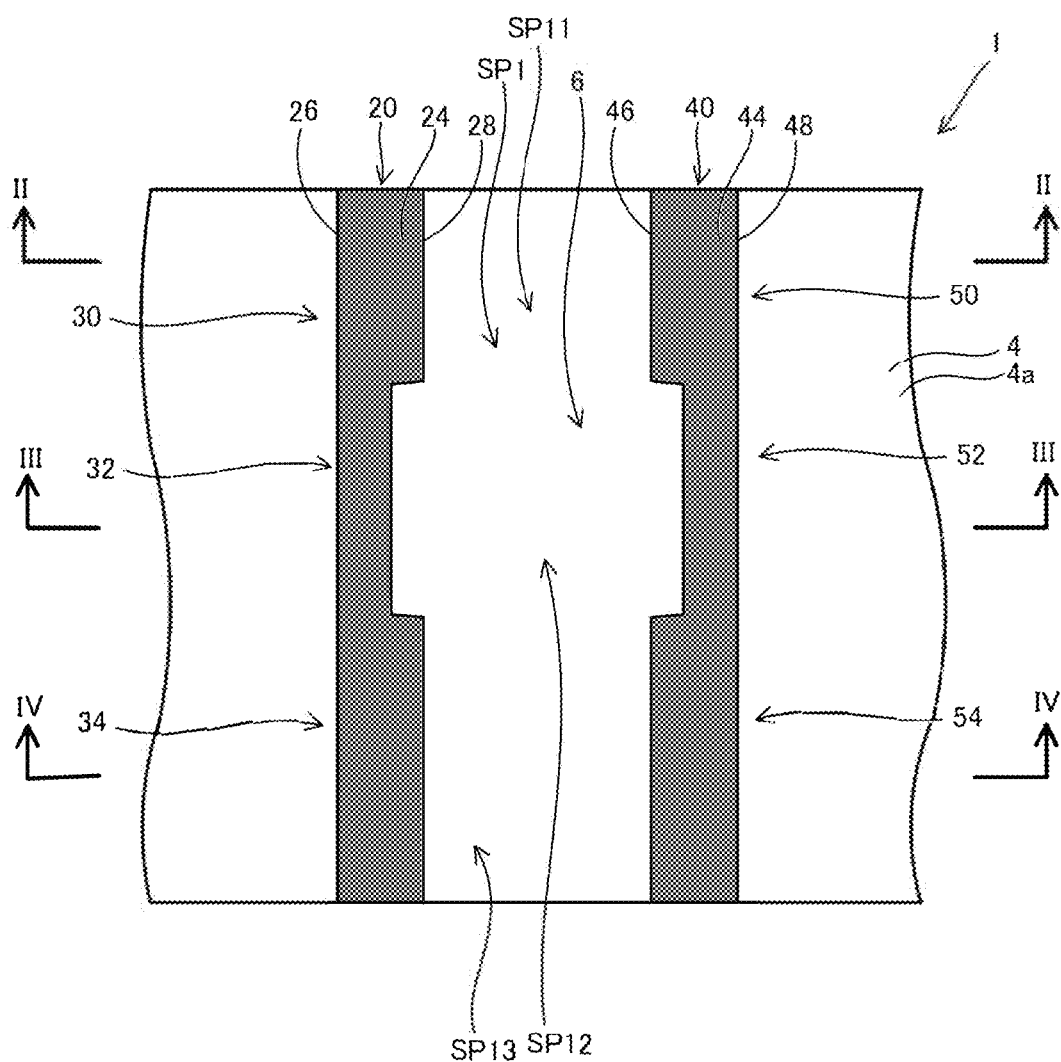
FIG. 1 is a plan view schematically illustrating a part of a printed wiring board according to an embodiment of the present invention.

Embodiments will now be described with reference to the accompanying drawings, wherein like reference numerals designate corresponding or identical elements throughout the various drawings.

Embodiment

Figure 2:
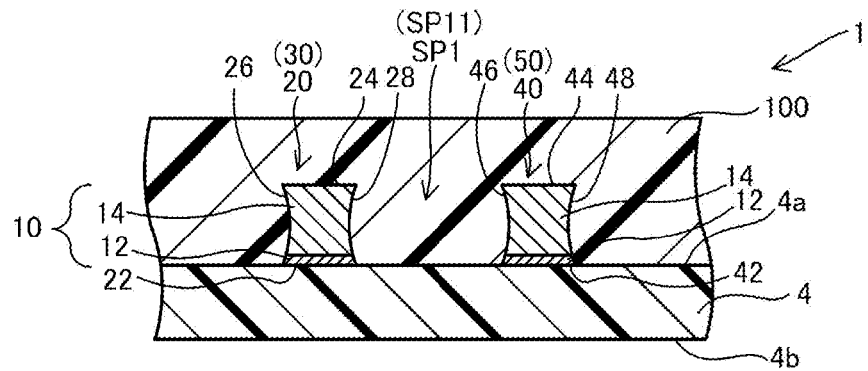
FIG. 2 is a cross-sectional view between II-II of FIG. 1.
Figure 3:
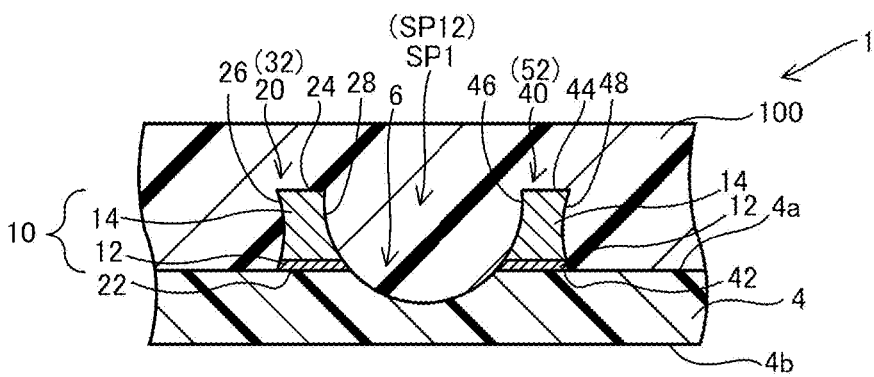
FIG. 3 is a cross-sectional view between of FIG. 1.
Figure 4:
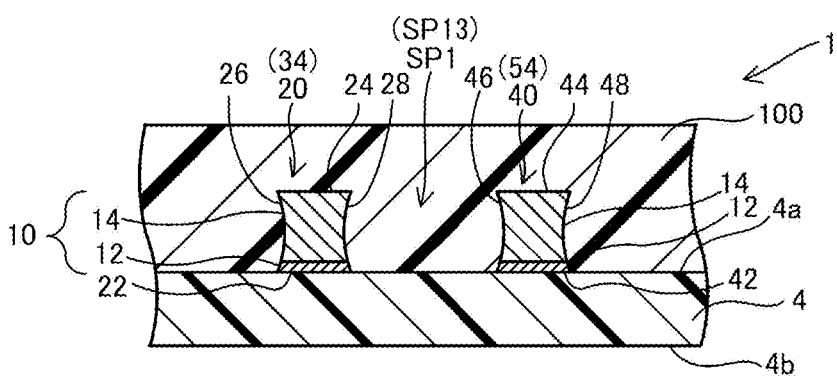
FIG. 4 is a cross-sectional view between Iv-Iv of FIG. 1.

FIG. 1 is a plan view illustrating a part of a printed wiring board 1 according to an embodiment of the present invention. FIG. 1 illustrates a first resin insulating layer 4 having a first surface (4a) and a conductor layer 10 formed on the first surface (4a) of the first resin insulating layer 4. FIGS. 2-4 are cross-sectional views of the printed wiring board 1 of FIG. 1. FIGS. 2-4 are each obtained by cutting the printed wiring board 1 of FIG. 1 in a plane perpendicular to the first surface (4a). FIG. 2 is a cross-sectional view between II-II of FIG. 1. FIG. 3 is a cross-sectional view between of FIG. 1. FIG. 4 is a cross-sectional view between Iv-Iv of FIG. 1.

As illustrated in FIGS. 2-4, the printed wiring board 1 includes the first resin insulating layer 4, the conductor layer 10 on the first resin insulating layer 4, and a second resin insulating layer 100 on the first resin insulating layer 4 and the conductor layer 10. The first resin insulating layer 4 can form a core substrate. The first resin insulating layer 4 can form a resin insulating layer that forms a build-up layer.

The first resin insulating layer 4 has the first surface (4a) and a second surface (4b) on the opposite side with respect to the first surface (4a). The first resin insulating layer 4 is formed using a thermosetting resin. The first resin insulating layer 4 may contain inorganic particles such as silica particles. The first resin insulating layer 4 may contain a reinforcing material such as a glass cloth.

The conductor layer 10 is formed on the first surface (4a) of the first resin insulating layer 4. The conductor layer 10 includes a first conductor circuit 20 and a second conductor circuit 40. The conductor layer 10 may include conductor circuits other than the first conductor circuit 20 and the second conductor circuit 40. As illustrated in FIG. 1, for example, planar shapes of upper surfaces of the first conductor circuit 20 and the second conductor circuit 40 are roughly rectangular. The first conductor circuit 20 is positioned adjacent to the second conductor circuit 40. The first conductor circuit 20 and the second conductor circuit 40 are positioned substantially in parallel. A space (SP1) is formed between the first conductor circuit 20 and the second conductor circuit 40. A width of the space (SP1) is, for example, 35 μm or less.

As illustrated in FIGS. 2-4, the first conductor circuit 20 and the second conductor circuit 40 are each formed of a seed layer 12 and an electrolytic plating film 14 on the seed layer 12. The seed layer 12 is an electroless plating film. The first conductor circuit 20 and the second conductor circuit 40 can each be formed of a metal foil, a seed layer on the metal foil, and an electrolytic plating film on the seed layer.

The first conductor circuit 20 has a first lower surface 22, a first upper surface 24, a first side wall 26, and a second side wall 28. The first lower surface 22 is a surface in contact with the first surface (4a) of the first resin insulating layer 4. The first upper surface 24 is a surface on the opposite side with respect to the first lower surface 22. The first side wall 26 is a side wall on a left side in FIG. 1. The second side wall 28 is a side wall on the opposite side with respect to the first side wall 26 (a side wall on a right side in FIG. 1).

The second conductor circuit 40 has a second lower surface 42, a second upper surface 44, a third side wall 46, and a fourth side wall 48. The second lower surface 42 is a surface in contact with the first surface (4a). The second upper surface 44 is a surface on the opposite side with respect to the second lower surface 42. The third side wall 46 is a side wall on a left side in FIG. 1. The fourth side wall 48 is a side wall on the opposite side with respect to the third side wall 46 (a side wall on a right side in FIG. 1).

The first conductor circuit 20 is positioned adjacent to the second conductor circuit 40 such that the second side wall 28 and the third side wall 46 face each other.

As illustrated in FIG. 1, the first conductor circuit 20 includes a first portion 30, a second portion 32 extending from the first portion 30, and a third portion 34 extending from the second portion 32. The second conductor circuit 40 includes a fourth portion 50, a fifth portion 52 extending from the fourth portion 50, and a sixth portion 54 extending from the fifth portion 52. The first portion 30 faces the fourth portion 50. The second portion 32 faces the fifth portion 52. The third portion 34 faces the sixth portion 54. FIG. 2 illustrates cross sections of the first portion 30 and the fourth portion 50. FIG. 3 illustrates cross sections of the second portion 32 and the fifth portion 52. FIG. 4 illustrates cross sections of third portion 34 and the sixth portion 54.

As illustrated in FIG. 1, the second side wall 28 of the second portion 32 is recessed from the second side wall 28 of the first portion 30 and the second side wall 28 of the third portion 34. The third side wall 46 of the fifth portion 52 is recessed from the third side wall 46 of the fourth portion 50 and the third side wall 46 of the sixth portion 54. The space (SP1) (second space (SP12)) between the second portion 32 and the fifth portion 52 is larger than the space (SP1) (first space (SP11)) between the first portion 30 and the fourth portion 50 and the space (SP1) (third space (SP13)) between the third portion 34 and the sixth portion 54 (SP1). Therefore, the second space (SP12) can be filled with the second resin insulating layer 100. A contact area between the first resin insulating layer 4 and the second resin insulating layer 100 positioned between the second portion 32 and the fifth portion 52 is large. According to the printed wiring board 1 of the embodiment, peeling between the first resin insulating layer 4 and the second resin insulating layer 100 can be suppressed.

Figure 5:
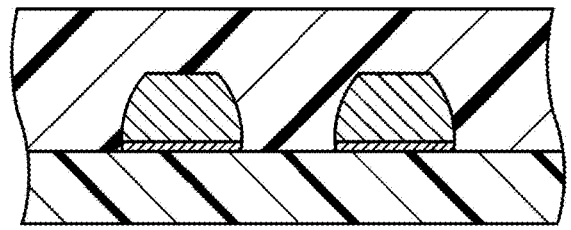
FIG. 5 is a cross-sectional view illustrating an example of bulging side walls.

As illustrated in FIGS. 2-4, the first side wall 26, the second side wall 28 of the first portion 30, and the second side wall 28 of the third portion 34 are curved from the first upper surface 24 toward the first lower surface 22. The first side wall 26, the second side wall 28 of the first portion 30, and the second side wall 28 of the third portion 34 are recessed. An example of bulging side walls is illustrated in FIG. 5. The second resin insulating layer 100 enters the recessed portions. The second resin insulating layer 100 that enters the recessed portions is unlikely to peel off upward. Therefore, peeling between the first resin insulating layer 4 and the second resin insulating layer 100 is suppressed. When the second side wall 28 of the first portion 30 and the second side wall 28 of the third portion 34 are recessed, recess amounts of the two are substantially equal to each other.

As illustrated in FIG. 3, the second side wall 28 of the second portion 32 gradually curves from the first upper surface 24 toward the first lower surface 22 such that the width of the second space (SP12) gradually decreases toward the first surface (4a). Therefore, when the second resin insulating layer 100 is filled in the second space (SP12), the second resin insulating layer 100 smoothly slides on the second side wall 28 of the second portion 32. The second space (SP12) can be easily filled with the second resin insulating layer 100.

The fourth side wall 48, the third side wall 46 of the fourth portion 50, and the third side wall 46 of the sixth portion 54 are curved from the second upper surface 44 toward the second lower surface 42. The fourth side wall 48, the third side wall 46 of the fourth portion 50, and the third side wall 46 of the sixth portion 54 are recessed. The second resin insulating layer 100 enters the recessed portions. When the third side wall 46 of the fourth portion 50 and the third side wall 46 of the sixth portion 54 are recessed, recess amounts of the two are substantially equal to each other.

As illustrated in FIG. 3, the third side wall 46 of the fifth portion 52 gradually curves from the second upper surface 44 toward the second lower surface 42 such that the width of the second space (SP12) gradually decreases toward the first surface (4*a*). Therefore, when the second resin insulating layer 100 is filled in the second space (SP12), the second resin insulating layer 100 smoothly slides on the third side wall 46 of the fifth portion 52. The second space (SP12) can be easily filled with the second resin insulating layer 100.

As illustrated in FIG. 3, the first resin insulating layer 4 formed between the second portion 32 and the fifth portion 52 has a recess 6. The recess 6 is included in the space (SP1).

As illustrated in FIGS. 2-4, the second resin insulating layer 100 is formed on the first surface (4*a*) of the first resin insulating layer 4 and on the conductor layer 10. The second resin insulating layer 100 fills the space (SP1) including the recess 6. Since the recess 6 is filled with the second resin insulating layer 100, the contact area between the first resin insulating layer 4 and the second resin insulating layer 100 is further increased. Peeling between the first resin insulating layer 4 and the second resin insulating layer 100 can be suppressed.

A second conductor layer having multiple conductor circuits can be formed on the second resin insulating layer 100. A solder resist layer having openings can be formed on the second conductor layer. Bumps can be formed in the openings of the solder resist layer. A printed wiring board 1 having the multiple conductor layers, the multiple resin insulating layers, the solder resist layer, and the bumps is obtained.

The second side wall 28 of the second portion 32 may be curved from the first upper surface 24 toward the first lower surface 22. In this case, the second side wall 28 of the second portion 32 is recessed. A recess amount of the second side wall 28 of the second portion 32 is smaller than a recess amount of the second side wall 28 of the first portion 30.

The third side wall 46 of the fifth portion 52 may be curved from the second upper surface 44 toward the second lower surface 42. In this case, the third side wall 46 of the fifth portion 52 is recessed. A recess amount of the third side wall 46 of the fifth portion 52 is smaller than a recess amount of the third side wall 46 of the fourth portion 50.

Method for Manufacturing Printed Wiring Board

Figure 6A:
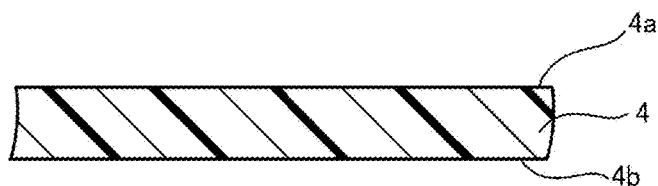
FIG. 6A is a cross-sectional view schematically illustrating a method for manufacturing a printed wiring board according to an embodiment of the present invention.
Figure 6B:
FIG. 6B is a cross-sectional view schematically illustrating the method for manufacturing a printed wiring board according to the embodiment of the present invention.
Figure 6C:
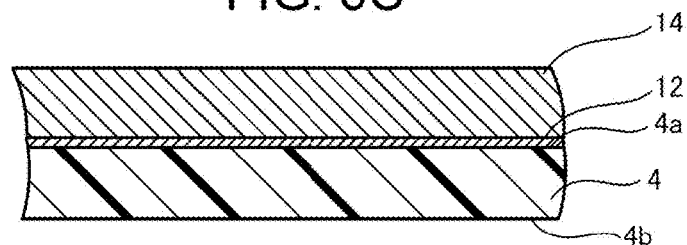
FIG. 6C is a cross-sectional view schematically illustrating the method for manufacturing a printed wiring board according to the embodiment of the present invention.
Figure 6D:
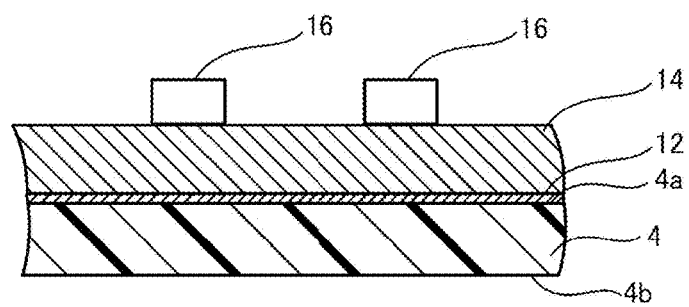
FIG. 6D is a cross-sectional view schematically illustrating the method for manufacturing a printed wiring board according to the embodiment of the present invention.
Figure 6E:
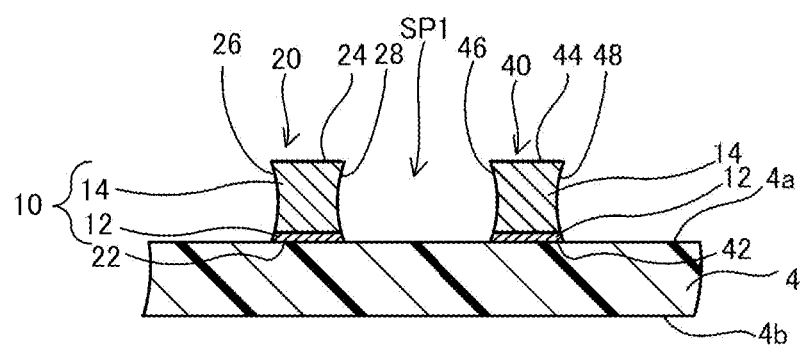
FIG. 6E is a cross-sectional view schematically illustrating the method for manufacturing a printed wiring board according to the embodiment of the present invention.
Figure 6F:
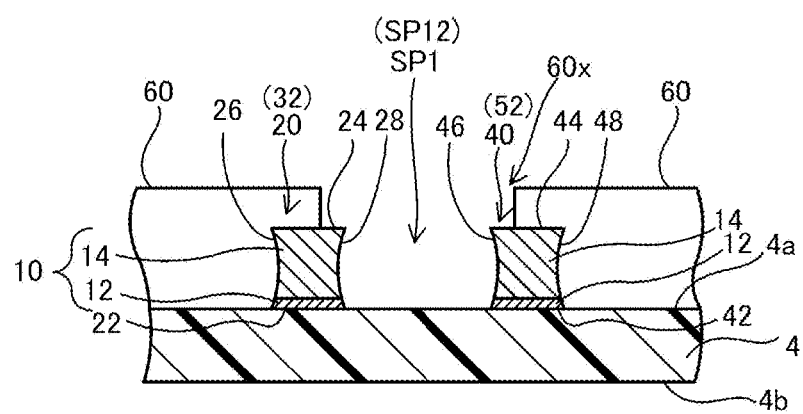
FIG. 6F is a cross-sectional view schematically illustrating the method for manufacturing a printed wiring board according to the embodiment of the present invention.
Figure 6G:
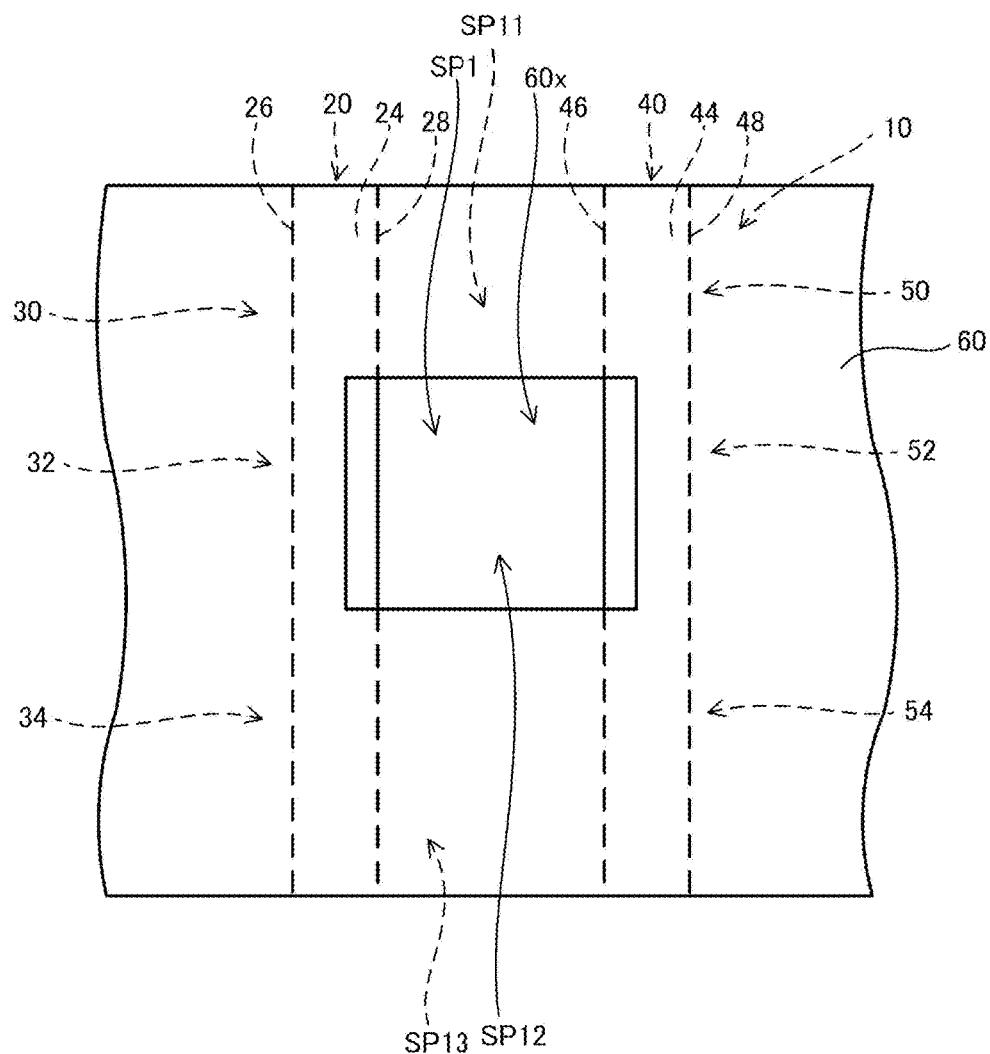
FIG. 6G is a plan view schematically illustrating the method for manufacturing a printed wiring board according to the embodiment of the present invention.

FIGS. 6A-6J illustrate a method for manufacturing a printed wiring board 1 according to an embodiment of the present invention. FIGS. 6A-6F and 6H-6J are cross-sectional views. FIG. 6G is a plan view. FIG. 6A illustrates the first resin insulating layer 4 having the first surface (4*a*) and the second surface (4*b*). As illustrated in FIG. 6B, the seed layer 12 is formed on the first surface (4*a*) of the first resin insulating layer 4. Next, as illustrated in FIG. 6C, the electrolytic plating film 14 is formed on the seed layer 12.

A metal foil can be formed on the first surface (4*a*) of the first resin insulating layer 4. In this case, the seed layer 12 is formed on the metal foil.

Next, as illustrated in FIG. 6D, an etching resist 16 is formed on the electrolytic plating film 14. The seed layer 12 and the electrolytic plating film 14 exposed from the etching resist 16 are removed (FIG. 6E). When a metal foil is formed under the seed layer 12, the metal leaf exposed from the etching resist 16 is also removed. After the etching process, the etching resist 16 is removed. As illustrated in FIG. 6E, the conductor layer 10 including the first conductor circuit 20 and the second conductor circuit 40 is formed. The first side wall 26 and the second side wall 28 of the first conductor circuit 20 are curved from the first upper surface 24 toward the first lower surface 22. The first side wall 26 and the second side wall 28 of the first conductor circuit 20 are recessed. The third side wall 46 and the fourth side wall 48 of the second conductor circuit 40 are curved from the second upper surface 44 toward the second lower surface 42. The third side wall 46 and the fourth side wall 48 of the second conductor circuit 40 are recessed. At this point, the second side wall 28 of the second portion 32 is not recessed from the second side wall 28 of the first portion 30 and the second side wall 28 of the third portion 34. The third side wall 46 of the fifth portion 52 is not recessed from the third side wall 46 of the fourth portion 50 and the third side wall 46 of the sixth portion 54.

As illustrated in FIGS. 6F and 6G, an etching resist 60 for forming the second portion 32 and the fifth portion 52 is formed on the conductor layer 10 and on the first surface (4*a*) of the first resin insulating layer 4. The etching resist 60 has an opening (60*x*). FIG. 6F is a cross-sectional view, and FIG. 6G is a plan view. The opening (60*x*) exposes a part of the first upper surface 24 and a part of the second side wall 28 of the first conductor circuit 20. The opening (60*x*) exposes a part of the second upper surface 44 and a part of the third side wall 46 of the second conductor circuit 40. The first side wall 26 and the fourth side wall 48 are covered by the etching resist 60.

The intermediate substrate illustrated in FIGS. 6F and 6G is immersed in an etching solution. The first conductor circuit 20 and the second conductor circuit 40 exposed from the opening (60*x*) are selectively dissolved. The first conductor circuit 20 and the second conductor circuit 40 covered by the etching resist 60 are not dissolved. Therefore, the width of the space (SP1) (the second space (SP12)) exposed from the opening (60*x*) is increased. The width of the space (SP1) (the first space (SP11) and the third space (SP13)) covered by the etching resist 60 is not changed. The second side wall 28 exposed from the opening (60*x*) is recessed from the second side wall 28 positioned under the etching resist 60 (FIG. 1). The third side wall 46 exposed from the opening (60*x*) is recessed from the third side wall 46 positioned under the etching resist 60 (FIG. 1).

Figure 6H:
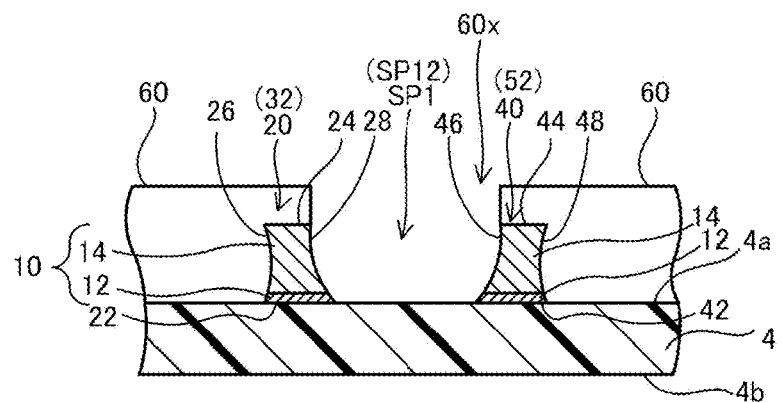
FIG. 6H is a cross-sectional view schematically illustrating the method for manufacturing a printed wiring board according to the embodiment of the present invention.

The upper surfaces (the first upper surface 24 and the second upper surface 44) of the first conductor circuit 20 and the second conductor circuit 40 exposed from the opening (60*x*) are selectively dissolved. Shapes of the second side wall 28 and the third side wall 46 exposed from the opening (60*x*) are changed. As illustrated in FIG. 6H, the second side wall 28 exposed from the opening (60*x*) gradually curves from the first upper surface 24 toward the first lower surface 22 such that the width of the space (SP1) gradually decreases toward the first surface (4*a*). The third side wall 46 exposed from the opening (60*x*) gradually curves from the second upper surface 44 toward the second lower surface 42 such that the width of the space (SP1) gradually decreases toward the first surface (4a). Shapes of the portions covered by the etching resist 60 are not changed.

Figure 6I:
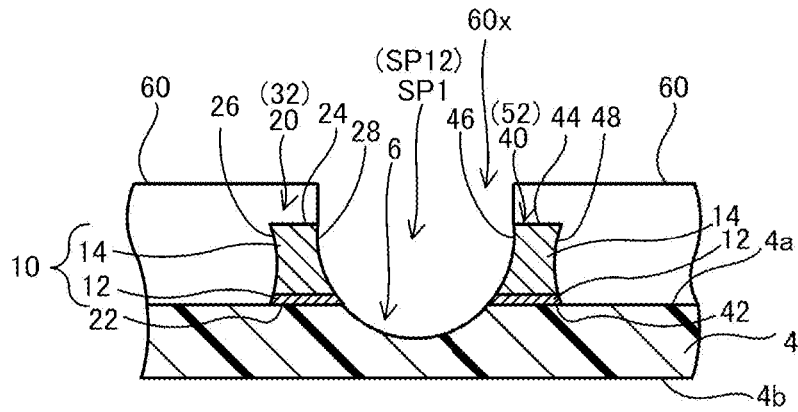
FIG. 6I is a cross-sectional view schematically illustrating the method for manufacturing a printed wiring board according to the embodiment of the present invention.
Figure 6J:
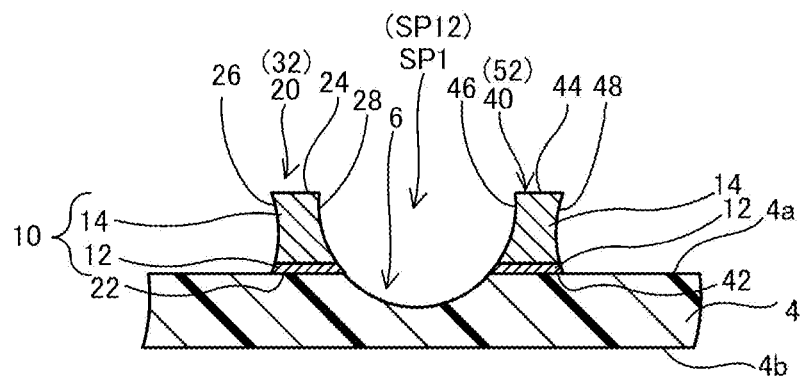
FIG. 6J is a cross-sectional view schematically illustrating the method for manufacturing a printed wiring board according to the embodiment of the present invention.

Laser is irradiated to the first resin insulating layer 4 exposed from the opening (60x). As illustrated in FIG. 6I, the recess 6 is formed on the first surface (4a) of the first resin insulating layer 4 exposed from the opening (60x). Energy of the laser for forming the recess 6 becomes weaker from a central portion toward a peripheral portion. A depth of the recess 6 increases from the first conductor circuit 20 toward a midpoint between the first conductor circuit 20 and the second conductor circuit 40. The depth of the recess 6 increases from the second conductor circuit 40 toward the midpoint between the first conductor circuit 20 and the second conductor circuit 40. The depth of the recess 6 is the largest at the midpoint between the first conductor circuit 20 and the second conductor circuit 40. Laser is irradiated to the first conductor circuit 20 and the second conductor circuit 40 exposed from the opening (60x). However, since the energy of the laser is weak in a peripheral portion of the laser, shapes of the first conductor circuit 20 and the second conductor circuit 40 exposed from the opening (60x) are not changed. As illustrated in FIG. 6J, the etching resist 60 is removed. The second portion 32 is formed from the first conductor circuit 20 exposed by the opening (60x). The fifth portion 52 is formed from the second conductor circuit 40 exposed by the opening (60x).

The second resin insulating layer 100 is formed on the first surface (4a) of the first resin insulating layer 4 and on the conductor layer 10. As illustrated in FIGS. 2-4, the second resin insulating layer 100 fills the space (SP1) including the recess 6. The second resin insulating layer 100 is in close contact with the first surface (4a), the first upper surface 24, the first side wall 26, the second side wall 28, the second upper surface 44, the third side wall 46, and the fourth side wall 48.

A second conductor layer can be formed on the second resin insulating layer 100 using a commonly known method. A solder resist layer having openings can be formed on the second conductor layer. Bumps can be formed on the second conductor layer exposed from the openings of the solder resist layer. The printed wiring board 1 of the embodiment is obtained.

First Modified Embodiment

Figure 7:
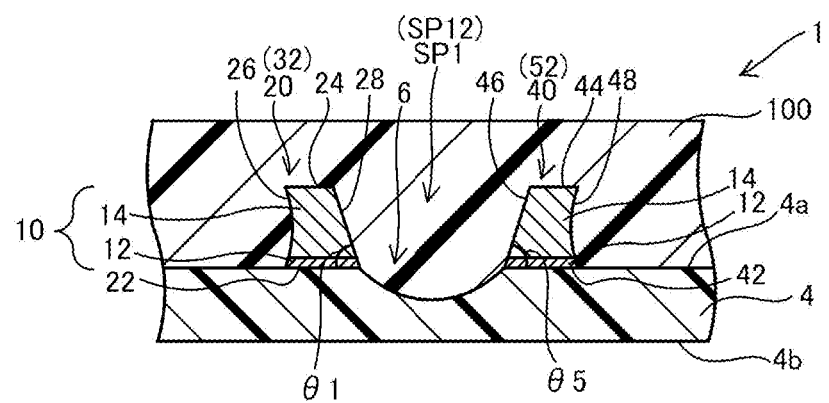
FIG. 7 is a cross-sectional view schematically illustrating a part of a printed wiring board according to a first modified embodiment of the present invention.

FIG. 7 illustrates a first modified embodiment according to the embodiment of the present invention. The first modified embodiment is different from the embodiment in the shape of the second side wall 28 of the second portion 32 and the shape of the third side wall 46 of the fifth portion 52. FIG. 7 is a cross-sectional view between of FIG. 1. As illustrated in FIG. 7, the second side wall 28 of the second portion 32 extends straight from the first upper surface 24 toward the first lower surface 22 such that the width of the second space (SP12) gradually decreases toward the first surface (4a). The third side wall 46 of the fifth portion 52 extends straight from the second upper surface 44 toward the second lower surface 42 such that the width of the second space (SP12) gradually decreases toward the first surface (4a). The second side wall 28 of the second portion 32 and the third side wall 46 of the fifth portion 52 are inclined with respect to the first surface (4a).

An angle (first angle) ($\theta 1$) between the second side wall 28 and the first lower surface 22 of the second portion 32 is 65 degrees or more and 85 degrees or less. An angle (fifth angle) ($\theta 5$) between the third side wall 46 and the second lower surface 42 of the fifth portion 52 is 65 degrees or more and 85 degrees or less. The first angle ($\theta 1$) and the fifth angle ($\theta 5$) are substantially equal to each other.

The printed wiring board 1 of the first modified embodiment is manufactured using the same manufacturing method as that of the embodiment. However, when the embodiment and the first modified embodiment of the embodiment are compared, the conditions for etching a part of the first conductor circuit 20 and a part of the second conductor circuit 40 are different. Examples of the etching conditions are a method for stirring the etching solution and a concentration of the etching solution. Since the etching conditions are different, the second side wall 28 of the second portion 32 and the third side wall 46 of the fifth portion 52 are formed straight.

Second Modified Embodiment

Figure 8:
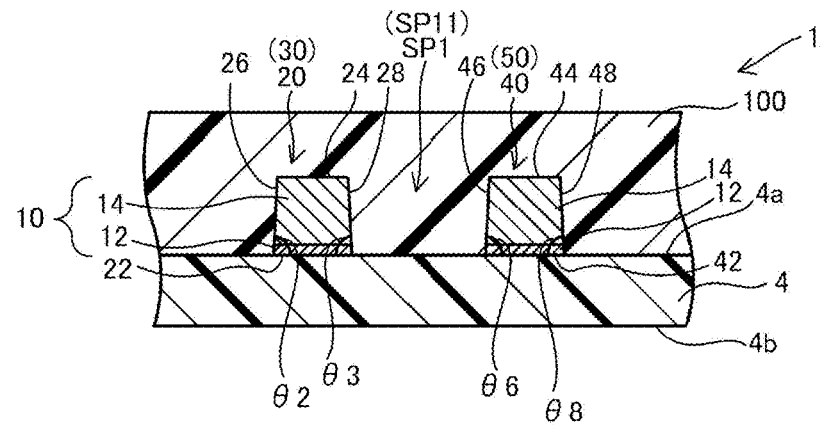
FIG. 8 is a cross-sectional view schematically illustrating a part of a printed wiring board according to a second modified embodiment of the present invention.
Figure 9:
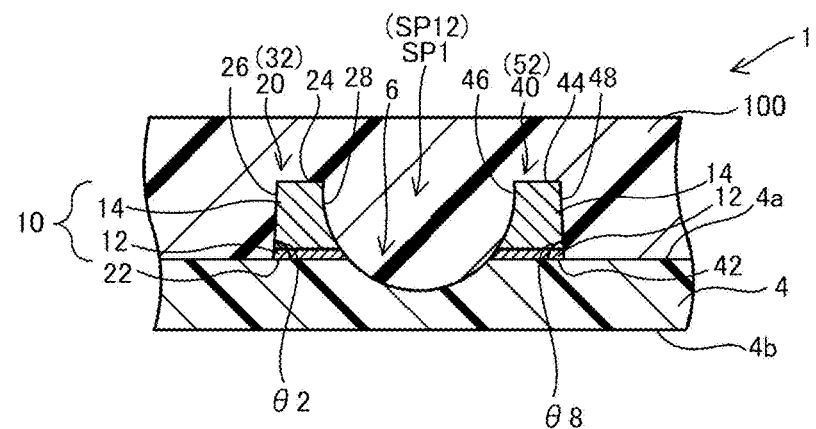
FIG. 9 is a cross-sectional view schematically illustrating a part of a printed wiring board according to the second modified embodiment of the present invention.
Figure 10:
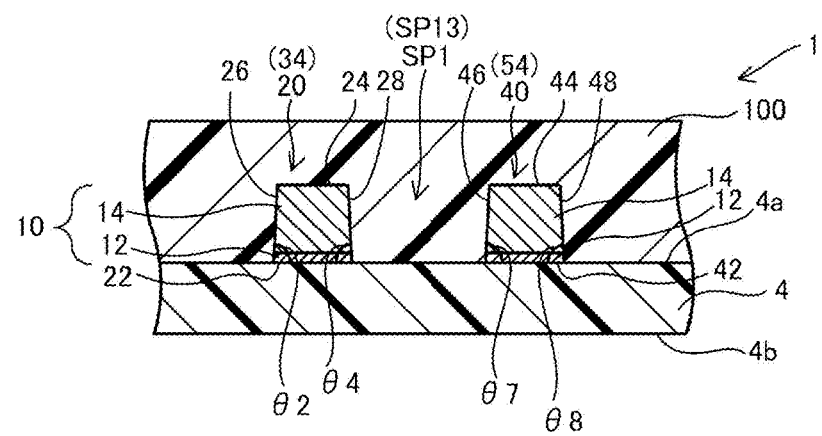
FIG. 10 is a cross-sectional view schematically illustrating a part of the printed wiring board according to the second modified embodiment of the present invention.

FIGS. 8-10 illustrate a second modified embodiment according to the embodiment of the present invention. When the embodiment and the second modified embodiment of the embodiment are compared, the shapes of the first side wall 26, the second side wall 28 of the first portion 30, the second side wall 28 of the third portion 34, the third side wall 46 of the fourth portion 50, the third side wall 46 of the sixth portion 54, and the fourth side wall 48 are different.

FIG. 8 is a cross-sectional view between II-II of FIG. 1. FIG. 9 is a cross-sectional view between of FIG. 1. FIG. 10 is a cross-sectional view between Iv-Iv of FIG. 1. As illustrated in FIGS. 8-10, the first side wall 26, the second side wall 28 of the first portion 30, and the second side wall 28 of the third portion 34 extend straight from the first upper surface 24 toward the first lower surface 22. The first side wall 26, the second side wall 28 of the first portion 30, and the second side wall 28 of the third portion 34 are inclined with respect to the first surface (4a). An angle (second angle) ($\theta 2$) between the first side wall 26 and the first lower surface 22 is 80 degrees or more and 88 degrees or less. An angle (third angle) ($\theta 3$) between the second side wall 28 of the first portion 30 and the first lower surface 22 is 80 degrees or more and 88 degrees or less. An angle (fourth angle) ($\theta 4$) between the second side wall 28 of the third portion 34 and the first lower surface 22 is 80 degrees or more and 88 degrees or less.

The third side wall 46 of the fourth portion 50, the third side wall 46 of the sixth portion 54, and the fourth side wall 48 extend straight from the second upper surface 44 toward the second lower surface 42. The third side wall 46 of the fourth portion 50, the third side wall 46 of the sixth portion 54, and the fourth side wall 48 are inclined with respect to the first surface (4a). An angle (sixth angle) ($\theta 6$) between the third side wall 46 of the fourth portion 50 and the second lower surface 42 is 80 degrees or more and 88; degrees or less. An angle (seventh angle) ($\theta 7$) between the third side wall 46 of the sixth portion 54 and the second lower surface 42 is 80 degrees or more and 88 degrees or less. An angle (eighth angle) ($\theta 8$) between the fourth side wall 48 and the second lower surface 42 is 80 degrees or more and 88 degrees or less. The second angle ($\theta 2$), the third angle ($\theta 3$), the fourth angle ($\theta 4$), the sixth angle ($\theta 6$), the seventh angle ($\theta 7$), and the eighth angle ($\theta 8$) are substantially equal to each other.

In the second modified embodiment, the side walls are not recessed. Therefore, a space between adjacent conductor circuits can be easily filled with the second resin insulating layer 100. Therefore, insulation resistance between adjacent conductor circuits can be increased.

In the embodiment, the conductor circuits illustrated in FIG. 6E are formed using a subtractive method. In contrast, in the second modified embodiment, the conductor circuits illustrated in FIG. 6E are formed using a SAP (Semi Additive Process) method. After that, using the same method as in the embodiment, the second portion 32 and the fifth portion 52 in the second modified embodiment are formed. The embodiment and the second modified embodiment differ in the method for forming the conductor circuits up to halfway in the formation. Therefore, the cross-sectional shapes of the conductor circuits are different between the embodiment and the second modified embodiment.

Another Embodiment of Second Modified Embodiment

Figure 11:
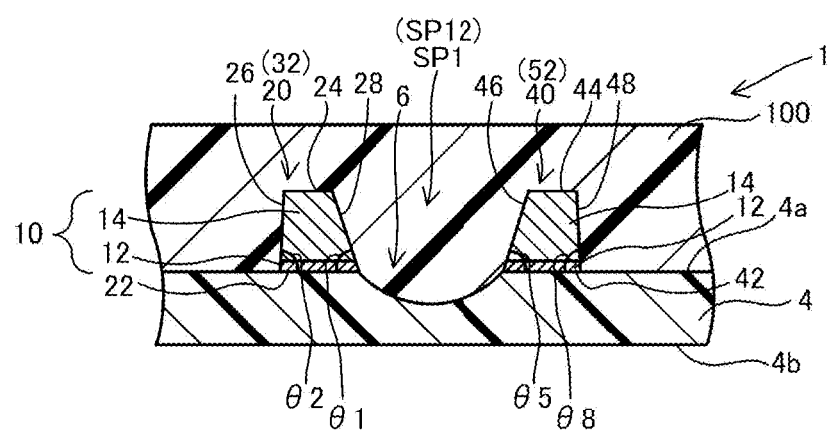
FIG. 11 is a cross-sectional view schematically illustrating a part of a printed wiring board of another embodiment according to the second modified embodiment of the present invention.

FIG. 11 illustrates another embodiment according to the second modified embodiment of the present invention. When the second modified embodiment and the other embodiment of the second modified embodiment are compared, the shape of the second side wall 28 of the second portion 32 and the shape of the third side wall 46 of the fifth portion 52 are different. FIG. 11 is a cross-sectional view between of FIG. 1. The second side wall 28 of the second portion 32 extends straight from the first upper surface 24 toward the first lower surface 22 such that the width of the second space (SP12) gradually decreases toward the first surface (4a). The third side wall 46 of the fifth portion 52 extends straight from the second upper surface 44 toward the second lower surface 42 such that the width of the second space (SP12) gradually decreases toward the first surface (4a). The second side wall 28 of the second portion 32 and the third side wall 46 of the fifth portion 52 are inclined with respect to the first surface (4a).

The first angle ($\theta1$) is 65 degrees or more and 85 degrees or less. The fifth angle ($\theta5$) is 65 degrees or more and 85 degrees or less. The first angle ($\theta1$) and the fifth angle ($\theta5$) are substantially equal to each other. The second angle ($\theta2$), the third angle ($\theta3$), the fourth angle ($\theta4$), the sixth angle ($\theta6$), the seventh angle ($\theta7$), and the eighth angle ($\theta8$) are larger than the first angle ($\theta1$) and the fifth angle ($\theta5$). However, when the second modified embodiment and the other embodiment of the second modified embodiment are compared, the conditions for etching a part of the first conductor circuit 20 and a part of the second conductor circuit 40 are different.

Third Modified Embodiment

A third modified embodiment according to the embodiment of the present invention and the other embodiments (the embodiment, the first modified embodiment, the second modified embodiment, the other embodiment of the second modified embodiment) are substantially the same. The differences are described below. In the third modified embodiment, the second side wall 28 of the second portion 32 is recessed from the second side wall 28 of the first portion 30 and the second side wall 28 of the third portion 34. The third side wall 46 of the fifth portion 52 is not recessed from the third side wall 46 of the fourth portion 50 and the third side wall 46 of the sixth portion 54. The third side wall 46 extends straight from the fourth portion 50 to the sixth portion 54.

In the wiring substrate of Japanese Patent Application Laid-Open Publication No. 2020-191388, the width of the space between adjacent wiring patterns is small. Therefore, it is thought difficult to fill the space with the second insulating layer. Further, the first insulating layer and the second insulating layer are bonded to each other by a portion exposed by the space. Therefore, when the space is small, a bonding area between the first insulating layer and the second insulating layer is small. As a result, it is thought that peeling occurs between the first insulating layer and the second insulating layer.

A printed wiring board according to an embodiment of the present invention includes: a first resin insulating layer having a first surface and a second surface on the opposite side with respect to the first surface; a conductor layer formed on the first surface of the first resin insulating layer; and a second resin insulating layer formed on the first surface of the first resin insulating layer and on the conductor layer. The conductor layer includes: a first conductor circuit having a first lower surface in contact with the first surface, a first upper surface on the opposite side with respect to the first lower surface, a first side wall, and a second side wall on the opposite side with respect to the first side wall; and a second conductor circuit having a second lower surface in contact with the first surface, a second upper surface on the opposite side with respect to the second lower surface, a third side wall, and a fourth side wall on the opposite side with respect to the third side wall. The first conductor circuit is positioned adjacent to the second conductor circuit such that the second side wall and the third side wall face each other. The first conductor circuit has a first portion, a second portion extending from the first portion, and a third portion extending from the second portion. The second conductor circuit has a fourth portion, a fifth portion extending from the fourth portion, and a sixth portion extending from the fifth portion. The first portion and the fourth portion face each other, the second portion and the fifth portion face each other, and the third portion and the sixth portion face each other. A space is formed between the first conductor circuit and the second conductor circuit. The second side wall of the second portion is recessed from the second side wall of the first portion and the second side wall of the third portion such that the space positioned between the second portion and the fifth portion becomes larger. The first resin insulating layer formed between the second portion and the fifth portion has a recess. The recess is included in the space. The second resin insulating layer fills the space.

In a printed wiring board according to an embodiment of the present invention, the second side wall of the second portion is recessed from the second side wall of the first portion and the second side wall of the third portion such that the space positioned between the second portion and the fifth portion becomes larger. Since the space positioned between the second portion and the fifth portion is large, the space can be filled with the second resin insulating layer. Further, when the space is large, a contact area between the first resin insulating layer and the second resin insulating layer positioned between the second portion and the fifth portion is large. Since the recess is filled with the second resin insulating layer, the contact area between the first resin insulating layer and the second resin insulating layer is further increased. Therefore, according to the printed wiring board of the embodiment, occurrence of peeling between the first resin insulating layer and the second resin insulating layer can be suppressed.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
a first resin insulating layer;
a conductor layer formed on a surface of the first resin insulating layer; and
a second resin insulating layer formed on the surface of the first resin insulating layer such that the second resin insulating layer is covering the conductor layer,
wherein the conductor layer includes a first conductor circuit and a second conductor circuit positioned adjacent to the first conductor circuit such that a space is formed between the first conductor circuit and the second conductor circuit, the first conductor circuit has a first side wall and a second side wall on an opposite side with respect to the first side wall, the second conductor circuit has a third side wall and a fourth side wall on an opposite side with respect to the third side wall such that the second side wall of the first conductor circuit faces the third side wall of the second conductor circuit, the first conductor circuit has a first portion, a second portion extending from the first portion, and a third portion extending from the second portion, the second conductor circuit has a fourth portion, a fifth portion extending from the fourth portion, and a sixth portion extending from the fifth portion such that the first portion of the first conductor circuit and the fourth portion of the second conductor circuit face each other, that the second portion of the first conductor circuit and the fifth portion of the second conductor circuit face each other, and that the third portion of the first conductor circuit and the sixth portion of the second conductor circuit face each other, the first conductor circuit is formed such that the second side wall of the second portion is recessed from the second side wall of the first portion and the second side wall of the third portion and that the space formed between the second portion of the first conductor circuit and the fifth portion of the second conductor circuit becomes larger, and the first resin insulating layer has a recess formed between the second portion of the first conductor circuit and the fifth portion of the second conductor circuit such that the second resin insulating layer is filling the space and the recess.

2. The printed wiring board according to claim 1, wherein the second conductor circuit is formed such that the third side wall of the fifth portion is recessed from the third side wall of the fourth portion and the third side wall of the sixth portion and that the space formed between the second portion and the fifth portion becomes larger.

3. The printed wiring board according to claim 2, wherein the first conductor circuit has a first lower surface in contact with the surface of the first resin insulating layer and a first upper surface on an opposite side with respect to the first lower surface and is formed such that the second side wall of the second portion gradually curves from the first upper surface toward the first lower surface and that a width of the space gradually decreases toward the surface of the first resin insulating layer, and the second conductor circuit has a second lower surface in contact with the surface of the first resin insulating layer and a second upper surface on an opposite side with respect to the second lower surface and is formed such that the third side wall of the fifth portion gradually curves from the second upper surface toward the second lower surface and that the width of the space gradually decreases toward the surface of the first resin insulating layer.

4. The printed wiring board according to claim 2, wherein the first conductor circuit has a first lower surface in contact with the surface of the first resin insulating layer and a first upper surface on an opposite side with respect to the first lower surface and is formed such that the second side wall of the second portion extends straight from the first upper surface toward the first lower surface and that a width of the space gradually decreases toward the surface of the first resin insulating layer, and the second conductor circuit has a second lower surface in contact with the surface of the first resin insulating layer and a second upper surface on an opposite side with respect to the second lower surface and is formed such that the third side wall of the fifth portion extends straight from the second upper surface toward the second lower surface such that the width of the space gradually decreases toward the surface of the first resin insulating layer.

5. The printed wiring board according to claim 4, wherein the first conductor circuit has a first lower surface in contact with the surface of the first resin insulating layer and a first upper surface on an opposite side with respect to the first lower surface and is formed such that the first conductor circuit has a first angle between the second side wall and the first lower surface of the second portion, a second angle between the first side wall and the first lower surface, a third angle between the second side wall of the first portion and the first lower surface, and a fourth angle between the second side wall of the third portion and the first lower surface, and the second conductor circuit has a second lower surface in contact with the surface of the first resin insulating layer and a second upper surface on an opposite side with respect to the second lower surface and is formed such that the second conductor circuit has a fifth angle between the third side wall of the fifth portion and the second lower surface, a sixth angle between the third side wall of the fourth portion and the second lower surface, a seventh angle between the third side wall of the sixth portion and the second lower surface, and an eighth angle between the fourth side wall and the second lower surface and that the second, third, fourth, sixth, seventh and eighth angles are larger than the first and fifth angles.

6. The printed wiring board according to claim 5, wherein the first conductor circuit is formed such that the first angle is in a range of 65 degrees to 85 degrees and that the second, third and fourth angles are in a range of 80 degrees to 88 degrees, and the second conductor circuit is formed such that the fifth angle is in a range of 65 degrees to 85 degrees and is substantially equal to the first angle and that the sixth, seventh and eighth angles are in a range of 80 degrees to 88 degrees and are substantially equal to the second, third and fourth angles.

7. The printed wiring board according to claim 5, wherein the first conductor circuit is formed such that the first angle is in a range of 65 degrees to 85 degrees and that the second, third and fourth angles are in a range of 80 degrees to 88 degrees, and the second conductor circuit is formed such that the fifth angle is in a range of 65 degrees to 85 degrees and that the sixth, seventh and eighth angles are in a range of 80 degrees to 88 degrees.

8. The printed wiring board according to claim 2, wherein the first conductor circuit has a first lower surface in contact with the surface of the first resin insulating layer and a first upper surface on an opposite side with respect to the first lower surface and is formed such that the first side wall, the second side wall of the first portion, and the second side wall of the third portion are curved from the first upper surface toward the first lower surface and recessed, and the second conductor circuit has a second lower surface in contact with the surface of the first resin insulating layer and a second upper surface on an opposite side with respect to the second lower surface and is formed such that the third side wall of the fourth portion, the third side wall of the sixth portion, and the fourth side wall are curved from the second upper surface toward the second lower surface and recessed.

9. The printed wiring board according to claim 1, wherein the first conductor circuit has a first lower surface in contact with the surface of the first resin insulating layer and a first upper surface on an opposite side with respect to the first lower surface and is formed such that the second side wall of the second portion gradually curves from the first upper surface toward the first lower surface and that a width of the space gradually decreases toward the surface of the first resin insulating layer.

10. The printed wiring board according to claim 1, wherein the first conductor circuit has a first lower surface in contact with the surface of the first resin insulating layer and a first upper surface on an opposite side with respect to the first lower surface and is formed such that the second side wall of the second portion extends straight from the first upper surface toward the first lower surface and that a width of the space gradually decreases toward the surface of the first resin insulating layer.

11. The printed wiring board according to claim 10, wherein the first conductor circuit has a first lower surface in contact with the surface of the first resin insulating layer and a first upper surface on an opposite side with respect to the first lower surface and is formed such that the first conductor circuit has a first angle between the second side wall and the first lower surface of the second portion, a second angle between the first side wall and the first lower surface, a third angle between the second side wall of the first portion and the first lower surface, and a fourth angle between the second side wall of the third portion and the first lower surface and that the second, third and fourth angles are larger than the first angle.

12. The printed wiring board according to claim 11, wherein the first conductor circuit is formed such that the first angle is in a range of 65 degrees to 85 degrees and that the second, third and fourth angles are in a range of 80 degrees to 88 degrees and are substantially equal to each other.

13. The printed wiring board according to claim 11, wherein the first conductor circuit is formed such that the first angle is in a range of 65 degrees to 85 degrees and that the second, third and fourth angles are in a range of 80 degrees to 88 degrees.

14. The printed wiring board according to claim 1, wherein the first conductor circuit has a first lower surface in contact with the surface of the first resin insulating layer and a first upper surface on an opposite side with respect to the first lower surface and is formed such that the first side wall, the second side wall of the first portion, and the second side wall of the third portion are curved from the first upper surface toward the first lower surface and recessed.

15. The printed wiring board according to claim 1, wherein the first and second conductor circuits are formed such that a width of the space formed between the first conductor circuit and the second conductor circuit is 35 μm or less.

16. The printed wiring board according to claim 15, wherein the second conductor circuit is formed such that the third side wall of the fifth portion is recessed from the third side wall of the fourth portion and the third side wall of the sixth portion and that the space formed between the second portion and the fifth portion becomes larger.

17. The printed wiring board according to claim 16, wherein the first conductor circuit has a first lower surface in contact with the surface of the first resin insulating layer and a first upper surface on an opposite side with respect to the first lower surface and is formed such that the second side wall of the second portion gradually curves from the first upper surface toward the first lower surface and that a width of the space gradually decreases toward the surface of the first resin insulating layer, and the second conductor circuit has a second lower surface in contact with the surface of the first resin insulating layer and a second upper surface on an opposite side with respect to the second lower surface and is formed such that the third side wall of the fifth portion gradually curves from the second upper surface toward the second lower surface and that the width of the space gradually decreases toward the surface of the first resin insulating layer.

18. The printed wiring board according to claim 16, wherein the first conductor circuit has a first lower surface in contact with the surface of the first resin insulating layer and a first upper surface on an opposite side with respect to the first lower surface and is formed such that the second side wall of the second portion extends straight from the first upper surface toward the first lower surface and that a width of the space gradually decreases toward the surface of the first resin insulating layer, and the second conductor circuit has a second lower surface in contact with the surface of the first resin insulating layer and a second upper surface on an opposite side with respect to the second lower surface and is formed such that the third side wall of the fifth portion extends straight from the second upper surface toward the second lower surface such that the width of the space gradually decreases toward the surface of the first resin insulating layer.

19. The printed wiring board according to claim 15, wherein the first conductor circuit has a first lower surface in contact with the surface of the first resin insulating layer and a first upper surface on an opposite side with respect to the first lower surface and is formed such that the second side wall of the second portion gradually curves from the first upper surface toward the first lower surface and that a width of the space gradually decreases toward the surface of the first resin insulating layer.

20. The printed wiring board according to claim 15, wherein the first conductor circuit has a first lower surface in contact with the surface of the first resin insulating layer and a first upper surface on an opposite side with respect to the first lower surface and is formed such that the second side wall of the second portion extends straight from the first upper surface toward the first lower surface and that a width of the space gradually decreases toward the surface of the first resin insulating layer.

\* \* \* \* \*